United States Patent
Matsumoto et al.

(10) Patent No.: US 6,954,194 B2
(45) Date of Patent: Oct. 11, 2005

(54) SEMICONDUCTOR DEVICE AND DISPLAY APPARATUS

(75) Inventors: Shoichiro Matsumoto, Ogaki (JP); Keiichi Sano, Gifu (JP)

(73) Assignee: Sanyo Electric Co., Ltd. (JP)

( * ) Notice: Subject to any disclaimer, the term of this patent is extended or adjusted under 35 U.S.C. 154(b) by 240 days.

(21) Appl. No.: 10/298,460

(22) Filed: Nov. 18, 2002

(65) Prior Publication Data

US 2003/0189535 A1 Oct. 9, 2003

(30) Foreign Application Priority Data

Apr. 4, 2002 (JP) .................................... 2002-102591

(51) Int. Cl.$^7$ ................................................. G09G 3/30
(52) U.S. Cl. ......................... 345/92; 345/76; 345/205; 345/206; 345/330
(58) Field of Search .......................... 345/76, 92, 205, 345/206, 330

(56) References Cited

U.S. PATENT DOCUMENTS

| | | | |
|---|---|---|---|
| 6,417,825 B1 * | 7/2002 | Stewart et al. ................. | 345/77 |
| 6,639,244 B1 * | 10/2003 | Yamazaki et al. ............. | 257/72 |
| 2001/0009283 A1 * | 7/2001 | Arao et al. .................... | 257/303 |
| 2002/0030190 A1 * | 3/2002 | Ohtani et al. .................. | 257/72 |
| 2002/0052086 A1 * | 5/2002 | Maeda .......................... | 438/283 |
| 2002/0117722 A1 * | 8/2002 | Osada et al. ................... | 257/379 |

* cited by examiner

Primary Examiner—Chanh Nguyen
Assistant Examiner—Alexander S. Beck
(74) Attorney, Agent, or Firm—Cantor Colburn LLP

(57) ABSTRACT

A semiconductor device for individually controlling an element to be driven, such as an electroluminescence element, includes a switching TFT which operates when a selection signal is applied to its gate and which also captures a data signal, and an element-driving TFT in which its drain is connected with a drive power source, its source is connected with the element to be driven, gate receives a data signal supplied from the switching TFT, for controlling electric power supplied from the drive power source to the element to be driven. The semiconductor device further includes a storage capacitor having a first electrode connected with the switching TFT and with the gate of the element-driving TFT and a second electrode connected between the source of the element-driving TFT and the element to be driven, for holding the gate-source voltage of the element-driving TFT in accordance with the data signal, and a switching element for controlling the potential of the second electrode of the storage capacitor. With such a configuration, all the above-described switches can be formed by TFTs of the same conductivity type and reliable supply of electric power to the element to be driven can be assured.

24 Claims, 11 Drawing Sheets

SEMICONDUCTOR DEVICE AND DISPLAY APPARATUS

BACKGROUND OF THE INVENTION

1. Field of the Invention

The present invention relates to a circuit configuration for controlling an element to be driven, such as an electroluminescence display element.

2. Description of Related Art

Electroluminescence (EL) display apparatuses using, as an emissive element, a self-emissive EL element in each pixel are advantageous in that they are self-emissive, are thin, and consume a small amount of power. Therefore, EL display apparatuses have attracted interest and have been studied as potential replacements for display apparatuses such as CRT or LCD displays.

In particular, there is anticipation that active matrix EL display apparatuses in which a switching element, such as a thin film transistor (TFT), for individually controlling the EL element is provided for each pixel to thereby control the EL element for each pixel will become available as high resolution display apparatuses.

FIG. 1 illustrates a circuit configuration of each pixel in an active matrix (including m rows and n columns) EL display apparatus. In the EL display apparatus, on a substrate, a plurality of gate lines GL extend in the row direction and a plurality of data lines DL and drive power source lines VL extend in the column direction. Each pixel includes an organic EL element 50, a switching TFT (first TFT) 10, a TFT (second TFT) 21 for driving the EL element (hereafter referred to as an element-driving TFT) and a storage capacitor Cs.

The first TFT 10 is connected with the gate line GL and the data line DL, and turns ON when a gate signal (a selection signal) is applied to the gate electrode of the TFT 10. At this time, a data signal supplied to the data line DL is stored in the storage capacitor Cs which is connected between the first TFT 10 and the second TFT 21. A voltage in accordance with the data signal, supplied via the first TFT 10, is applied to the gate electrode of the second TFT 21, which then supplies a current in accordance with the applied voltage value from the power source line VL to the organic EL element 50. In the organic EL element 50, holes injected from the anode and electrons introduced from the cathode are recombined in the emissive layer, to thereby excite emissive molecules. Through the process in which these emissive molecules excite until deactivation, the organic EL element 50 projects light. The emission brightness of the organic EL element 50 is substantially proportional to the current supplied to the organic EL element 50. Therefore, by controlling the current to be supplied to the organic EL element 50 in accordance with a data signal for each pixel as described above, the organic EL element is caused to emit light of a brightness corresponding to the data signal, so that a desired image is displayed by the display apparatus as a whole.

In such an organic EL display apparatus, in order to achieve high display quality, it is necessary to cause the organic EL element 50 to reliably emit light at a brightness corresponding to a data signal. Accordingly, for the active matrix type EL display apparatus, it is required that the drain current does not change in the second TFT 21 which is disposed between the drive power source line VL and the organic EL element 50, even when the anode potential of the organic EL element 50 changes due to a current flowing through the EL element 50.

For this reason, as shown in FIG. 1, for the second TFT 21 is often adopted a p-channel TFT in which the source is connected with the drive power source line VL, the drain is connected with the organic EL element 50 on the anode side, and the source-drain current can be controlled by a potential difference Vgs between the source and the gate to which a voltage in accordance with a data signal is applied.

When a p-channel TFT is employed as the second TFT 21, however, there is a problem that a voltage change of the drive power source line VL causes a change in the emission brightness of each element 50, because in the p-ch TFT the source is connected with the drive power source line VL and the drain current, namely a current to be supplied to the organic EL element 50, is controlled by a potential difference between the source and the gate, as described above. Because the organic EL element 50 is a driven-by-current type element as described above, when a bright image is displayed for a certain frame period (when, for example, a large white area is displayed), for example, a great amount of current flows at a time from a single drive power source Pvdd to a large number of organic EL elements 50 on the substrate via the corresponding drive power source lines VL, and the potential of these drive power source lines VL changes. Further, in a region which is far from the drive power source Pvdd and has a significant voltage drop due to line resistance of the drive power source line VL, such as in a pixel positioned distant from the power source, the drive power source line VL at a low voltage results in the emission brightness of each organic EL element 50 being lower than that of elements located closer to the power source.

In addition, when a p-ch TFT is used as the second TFT 21, it is necessary to reverse the polarity of a data signal to be supplied to the second TFT 21 with regard to the polarity of a video signal, and thus necessary to provide a polarity reverse means in the driver circuit.

SUMMARY OF THE INVENTION

In order to solve the above problems, an object of the present invention is to ensure that electric power supplied from the drive power source line to the element to be driven is unaffected by the voltage change of the drive power source.

Another object of the present invention is to match the polarity of a data signal supplied to the element-driving thin film transistor with the polarity of a video signal, to thereby simplify a drive circuit.

In order to achieve the foregoing objects, in accordance with one aspect of the present invention, there is provided a semiconductor device comprising a switching thin film transistor which operates when a selection signal is applied to gate and also captures a data signal; an element-driving thin film transistor a drain of which is connected with a drive power source connected with the element to be driven, said gate receiving a data signal supplied from the switching thin film transistor, for controlling electric power supplied from the drive power source to the element to be driven; a storage capacitor having a first electrode connected with the switching thin film transistor and with the gate of the element-driving thin film transistor and a second electrode connected between the source of the element-driving thin film transistor and the element to be driven, for holding a gate-source voltage of the element-driving thin film transistor in accordance with the data signal; and a switching element for controlling a potential of the second electrode of the storage capacitor.

In accordance with anther aspect of the present invention, there is provided an active matrix display apparatus including a plurality of pixels arranged in a matrix, in which each pixel comprises at least an element to be driven; a switching thin film transistor which operates when a selection signal is applied to gate and also captures a data signal; an element-driving thin film transistor in which a drain is connected with a drive power source, a source is connected with the element to be driven, and a gate receives a data signal supplied from the switching thin film transistor, for controlling electric power supplied from the drive power source to the element to be driven; a storage capacitor having a first electrode connected with the switching thin film transistor and with the gate of the element-driving thin film transistor and a second electrode connected between the source of the element-driving thin film transistor and the element to be driven, for holding a gate-source voltage of the element-driving thin film transistor in accordance with the data signal; and a switching element for controlling a potential of the second electrode of the storage capacitor.

As described above, because a voltage between the gate and the source connected with the element to be driven, of the element-driving thin film transistor (also referred to as a gate-source voltage) is held by the storage capacitor, it is possible to supply a current in accordance with a data signal to the element to be driven, even when the element to be driven is activated and the source potential of the element-driving thin film transistor connected to the driven element is increased, and an n-channel (n-ch) thin film transistor can be used as the element-driving thin film transistor. Further, as the power supply to the element to be driven is unlikely to be affected by a voltage change in the drive power source line, stability of the power supply can be assured.

Preferably, the n-channel thin film transistor includes an LD region in which a low concentration of impurities is doped between a channel region and each of source and drain regions in which a high concentration of impurities is doped.

In particular, the LD region of this driving transistor is preferably made larger than the LD region of n-channel transistor at least in a peripheral circuit, and is preferably larger than the LD region of the switching transistor.

Consequently, accuracy of adjustment of the current amount with respect to a change in the voltage applied to the gate can be increased without increasing the transistor. Further, because the space required for layout of the transistor is reduced, increased brightness as a result of increased aperture ratio and reduction in the power consumption can both be achieved.

In accordance with another aspect of the present invention, the element to be driven is an electroluminescence element. Because the brightness of light emitted by an electroluminescence element corresponds to the supplied current, for example, it is possible to cause each element to emit light at brightness in accordance with a data signal by supplying a current in the circuit configuration described above.

In accordance with still another aspect of the present invention, the switching element controls the potential of the second electrode of the storage capacitor in accordance with the switching ON and OFF of the switching thin film transistor.

In accordance with a further aspect of the present invention, the switching element controls the second electrode of the storage capacitor at a fixed potential when the switching thin film transistor is ON.

In accordance with a still further aspect of the present invention, the switching element controls the second electrode of the storage capacitor at the fixed potential before the switching thin film transistor is turned ON, and stops the potential control for the second electrode of the storage capacitor after the switching thin film transistor is turned OFF.

In accordance with another aspect of the present invention, the switching element is a thin film transistor and controls the potential of the second electrode of the storage capacitor in accordance with a predetermined reset signal or a selection signal supplied to the switching thin film transistor.

By controlling the potential of the second electrode of the storage capacitor under control of the switching element as described above, it is possible to reliably and easily accumulate a charge in accordance with a data signal in the storage capacitor and maintain the gate-source voltage of the element-driving transistor for a predetermined period.

In accordance with another aspect of the present invention, the switching element is connected with the source of the element-driving thin film transistor and is used for discharging, at predetermined timing, a charge accumulated in the element to be driven.

According to the present invention, because the switching element connected to the element to be driven is provided in each pixel corresponding to each element to be driven, it is possible to reliably and simply discharge the element to be driven through the switching element, and therefore without providing any additional element for this purpose.

In accordance with another aspect of the present invention, the switching element is connected with the source of the element-driving thin film transistor and is used for measuring the source potential or current of the element-driving thin film transistor connected to the element to be driven.

Because the switching element which is formed by a thin film transistor, for example, is connected with the source of the element-driving thin film transistor, by controlling the switching element ON, the source potential or current of the element-driving thin film transistor can be detected through the switching element. It is therefore possible to perform such a measurement in order to verify, before use, an estimated amount of current to be supplied to the element to be driven.

Further, the present invention provides an organic EL display apparatus including a plurality of electroluminescence elements arranged in a matrix, in which a driving transistor is provided corresponding to each electroluminescence element for controlling a drive current to be supplied to the electroluminescence element, and the driving transistor is an n-ch transistor and includes an LD region in which a low concentration of impurities is doped between a channel region and each of source and drain regions in which a high concentration of impurities is doped. In particular, it is preferable that the LD region of the driving transistor is larger than the LD region at least in a peripheral transistor.

By providing such a large LD region, it is possible to control a current to be supplied to the electroluminescence element with high accuracy while securing a high aperture ratio.

It is also preferable that the gate of the driving transistor is connected with the switching transistor and one end of the capacitor, a connection point of the electroluminescence element and the driving transistor is connected to a low voltage power source via the discharge transistor, and the connection point of the electroluminescence element and the driving transistor is also connected to other end of the capacitor.

As described above, according to the present invention, it is possible to reliably supply electric power to an element to be driven such as an electroluminescence element.

Further, a data signal used for operating the element to be driven can be generated and used without the need, for example, for reversing the polarity with regard to a video signal in a display apparatus.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

Preferred embodiments of the present invention will be described with reference to the drawings.

Figure 1:
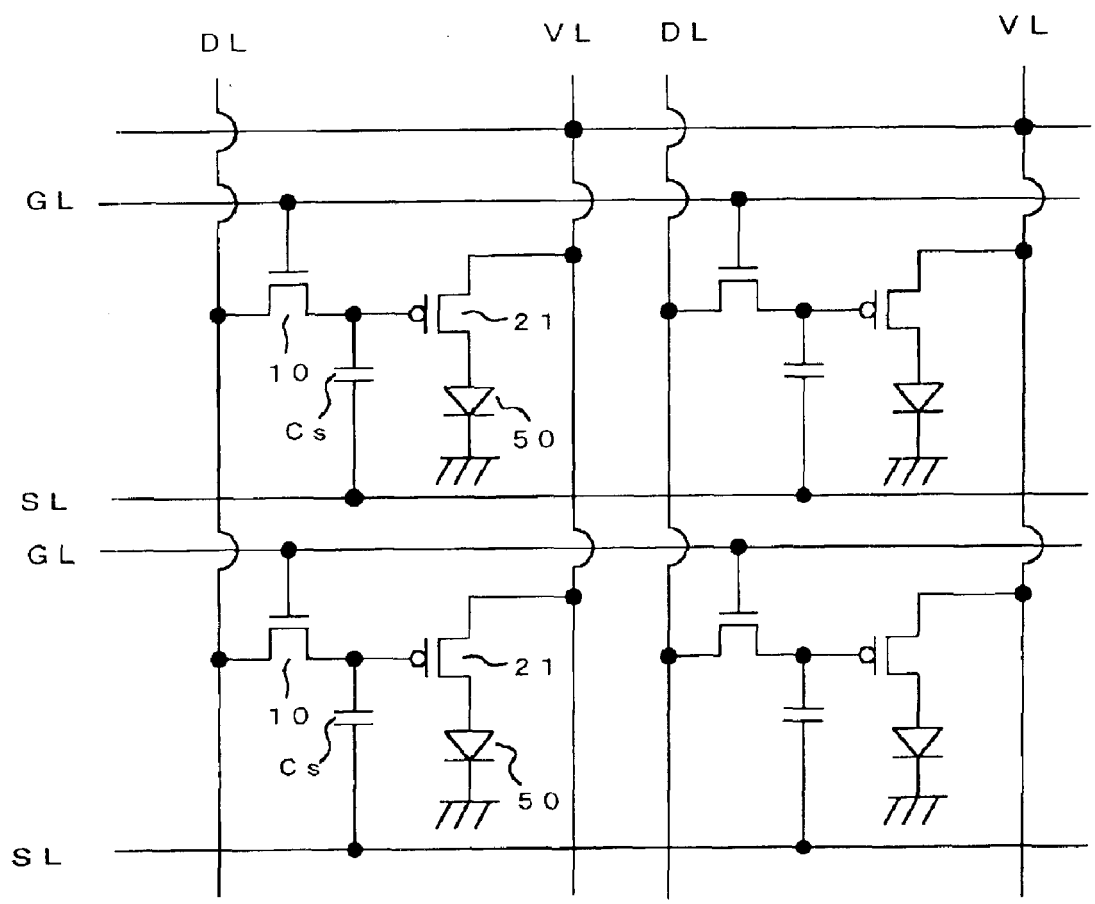
FIG. 1 is a view showing a circuit configuration of an active matrix type organic EL display apparatus of a prior art.
Figure 2:
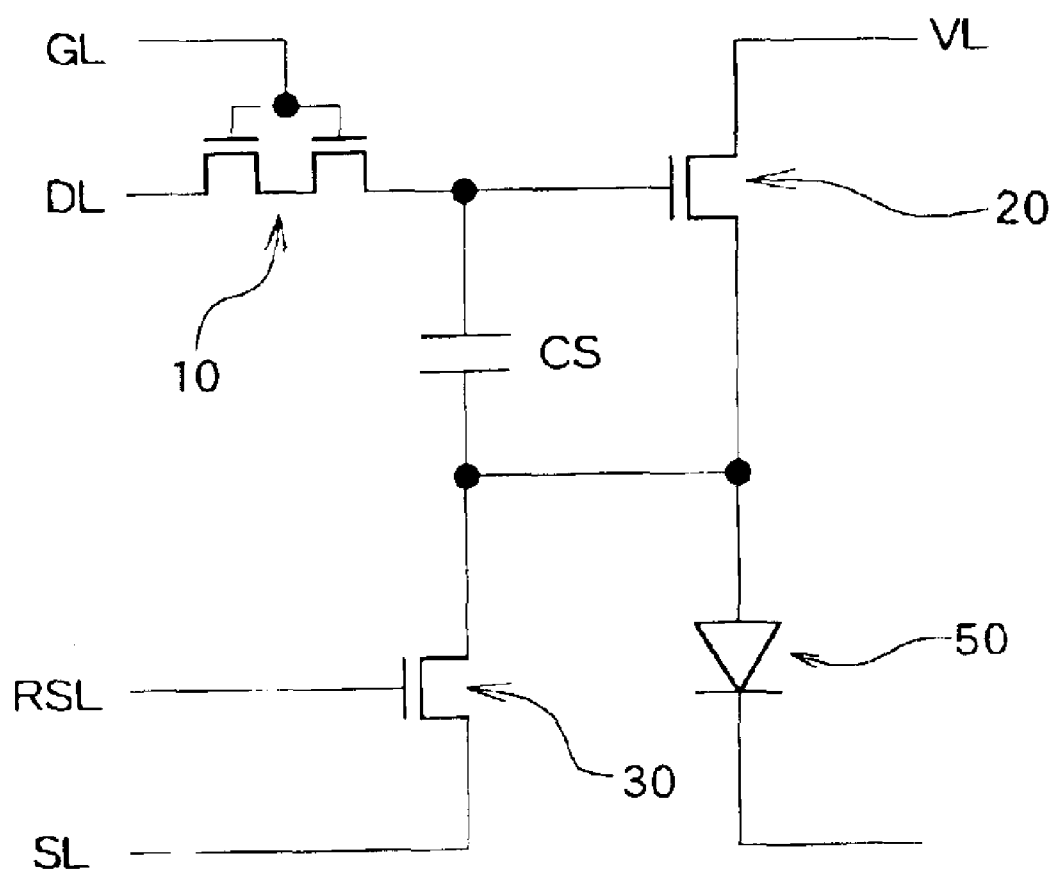
FIG. 2 is a view showing an exemplary configuration of a circuit, corresponding to one pixel, for driving an organic EL element, in accordance with an embodiment of the present invention.

FIG. 2 shows a configuration of a circuit for driving an organic EL element in accordance with one embodiment of the present invention. In this example, specific description will be provided using a circuit configuration corresponding to one pixel of an active matrix organic EL display apparatus, as shown in FIG. 2.

Referring to FIG. 2, within one pixel, an organic EL element 50 which acts as an element to be driven or a display (pixel) element, a switching thin film transistor (first TFT) 10, an element-driving thin film transistor (second TFT) 20, and a resetting thin film transistor (third TFT) 30 which serves as a switching element used for resetting, are provided.

The first TFT 10 is formed by an n-channel TFT in this example. In this first TFT 10, a gate electrode is connected with a gate line GL, a drain is connected with a data line DL, and a source is connected with the second TFT 20 and with a storage capacitor Cs, as will be further described.

In the second TFT 20, which is formed by an n-ch TFT in this embodiment, the drain is connected with a drive power source Pvdd (which is actually a drive power source line VL in this example), and the source is connected with the organic EL element on the side of an anode. Further, a gate of the second TFT 20 is connected to the source of the first TFT 10 and also with a first electrode of the storage capacitor Cs, which will be described below.

The storage capacitor Cs has the first electrode which is connected to the source of the first TFT 10 and the gate of the second TFT 20, and a second electrode which is connected between the source of the second TFT 20 and the anode of the organic EL element 50.

The third TFT (discharging transistor) 30 is also formed by an n-ch TFT (though it may be a p-ch TFT). In this third TFT 30, gate is connected with a reset line RSL to which a reset signal is to be applied, the drain is connected with the second electrode of the storage capacitor Cs, and the source is connected with a capacitor line SL to which a voltage for defining the second electrode potential of the storage capacitor Cs is supplied.

In the circuit configured as described above, the first TFT 10 turns ON in response to a selection signal (a gate signal) applied to the gate line GL. The third TFT 30 is controlled ON or OFF at substantially the same timing as the ON-OFF control of the first TFT 10. Therefore, when the first TFT 10 turns ON, the third TFT 30 is also turned ON by a reset signal, and the second electrode of the storage capacitor Cs has a potential which is equal to a fixed potential Vs1 (e.g. 0V) of the capacitor line SL connected with the third TFT 30. Thus, when the first TFT 10 turns ON and the source voltage of the first TFT 10 becomes equal to the voltage of a data signal supplied to the data line DL, the storage capacitor Cs is charged in accordance with a difference between the fixed potential of its second electrode and the source potential of the first TFT 10, which is substantially a voltage corresponding to a data signal.

When the second TFT 20 is switched ON by application of a voltage in accordance with a charge held on the storage capacitor Cs onto the gate of the second TFT 20, a current in accordance with the gate voltage of the second TFT 20 is supplied to the organic EL element 50 from the drive power source line VL through the drain-source of the second TFT 20. Consequently, the source potential of the second TFT 20 is increased in accordance with an amount of current flowing therethrough. At this time, the third TFT 30 is controlled OFF, so that the second electrode of the storage capacitor Cs is disconnected from the capacitor line SL. This causes the storage capacitor Cs to be connected between the gate and source of the second TFT 20, in which state an increase in the source potential causes a corresponding increase in the gate potential, and the gate-source voltage Vgs of the second TFT 20 in accordance with a data signal is maintained by the storage capacitor Cs.

According to the circuit configuration of the present embodiment, as described above, even when current flows through the organic EL element 50 to thereby increase the source potential of the second TFT 20, constant supply of a current in accordance with a data signal to the organic EL element 50 can be ensured by the function of the storage capacitor Cs. Further, as an n-ch TFT is employed as the second TFT 20, a data signal having the same polarity as that of a video signal can be used. Moreover, because the drive power source Pvdd to which the drain of the second TFT 20 is connected has a sufficiently high voltage such as 14V, it is possible to drive the second TFT 20, which is an n-ch TFT, in its saturated region, so that the organic EL element 50 can be supplied with a current independent from a change in the source-drain voltage. It should be noted that each circuit element can be driven, with a gate signal which is supplied to the gate line GL being in a range of, for example, 0V to 12V, a data signal being 1V to 6V, and the fixed potential of the capacitor line SL being approximately 0V.

Further, as will be described later, the n-ch second TFT 20 may adopt a so-called LDD structure (which will be referred to as an LD structure in the present specification) having a region in which a low concentration of impurities are doped, between the channel and each of the drain and source.

Figure 3A:
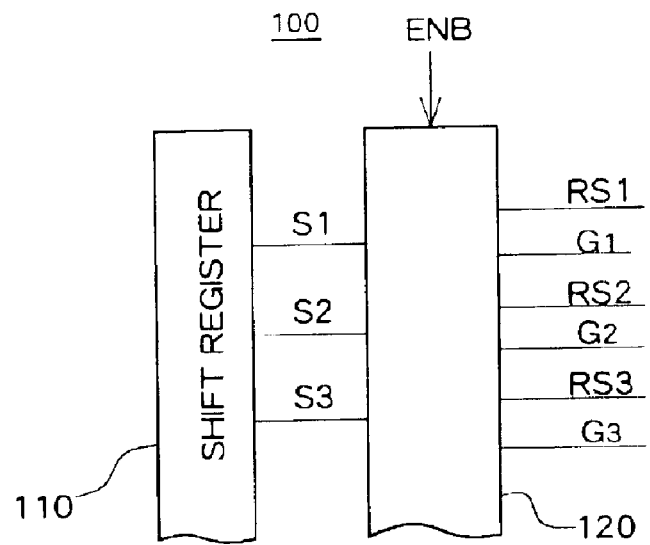
FIGS. 3A and 3B are views showing an exemplary configuration of a circuit for generating a gate signal and a reset signal to be supplied to each pixel in accordance with the present invention.
Figure 3B:
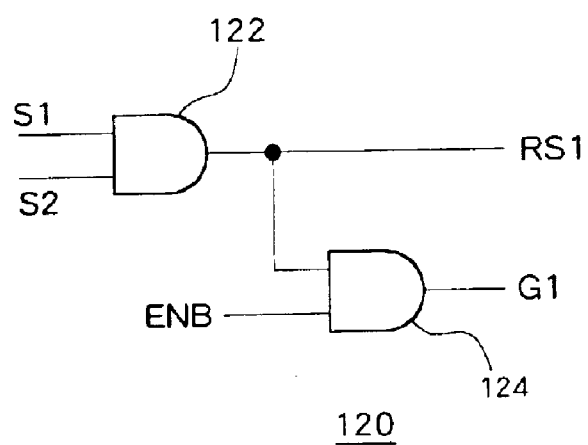

FIGS. 3A and 3B schematically show a circuit for supplying a gate signal (G1~Gm) and a reset signal (RS1~RSm) corresponding to each pixel configured as described above, and FIG. 4 shows the operation of the circuit shown in FIGS. 3A and 3B. In an active matrix organic EL display apparatus, the first TFTs 10 in each of the pixels arranged in a matrix is sequentially selected for each row (for each gate line GL) by a gate signal output from a vertical driver which is schematically shown in FIGS. 3A and 3B, and a data signal on the corresponding data line DL which is output from a horizontal driver (not shown) is captured.

A shift register 110 of the vertical driver 100 shifts a vertical start pulse at every 1H (one horizontal scanning period), and sequentially outputs a shift pulse S1, S2, S3 Sm to the output section 120.

The output section 120 is configured, for example, as shown in FIG. 3B. Specifically, the output section 120 has two AND gates 122 and 124 corresponding to each row for sequentially outputting a gate signal G1, G2, G3 . . . Gm and a reset signal RS1, RS2, R3 . . . Rsm to the corresponding line. The AND gate 122 performs logical AND operation on two shift pulses which are successive with respect to time sequence. To one input end of the AND gate 124, an enable signal ENB (see FIG. 4) which inhibits a gate signal from being output to the gate line is supplied at a switching period of 1H. Therefore, the AND gate 124 performs logical AND operation on this ENB and the output of the AND gate 122. The logical product of the two shift pulses (which are S1 and S2 in the example of FIGS. 3A and 3B) output from the AND gate 122 is used as a reset signal RS (which is RS1 in FIGS. 3A and 3B) in this embodiment. The AND gate 124 outputs a result of the above-described logical AND operation as a gate signal (which is G1 in FIGS. 3A and 3B) to each gate line GL, only at a period in which output of the AND gate 124 is enabled by an ENB signal.

Figure 4:
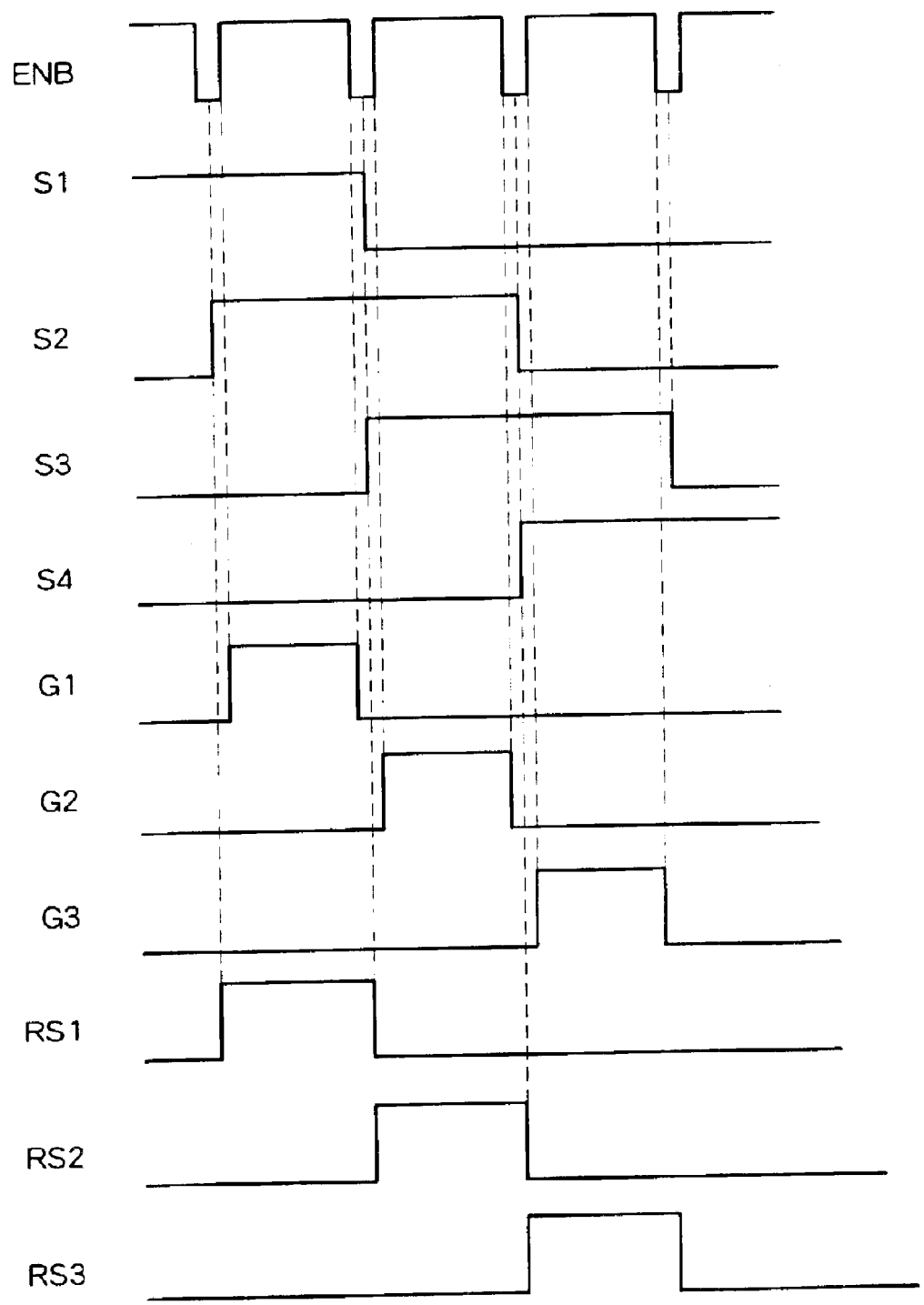
FIG. 4 is a timing chart showing an operation of the circuit shown in FIGS. 3A and 3B.

The reset signal RS output from the AND gate 122 is applied to the gate of the third TFT 30 of a corresponding pixel via the rest line RSL, as described above, and the gate signal is applied to the gate of the first TFT 10 of the corresponding pixel. Here, the reset signal RS and the gate signal G generated by the circuit shown in FIGS. 3A and 3B has a relationship as shown in FIG. 4. Specifically, as can be seen from the comparison of G1 and RS1 applied to the pixel at the first row, for example, the H level period of the gate signal G (ON control period for the n-ch TFT 10) is shorter than the H level period of the reset signal RS (ON control period for the n-ch TFT 30) by a period which is limited by the ENB signal.

Accordingly, in an example case of the pixel at the first row which is controlled by G1 and RS1, the third TFT 30 is first turned ON by the reset signal RS1. After the second electrode of the storage capacitor Cs is fixed to the potential of the storage capacitor line, the first TFT 10 turns ON by the gate signal G1, and a voltage which is substantially the same as that of data signal on the data line DL is applied to the first electrode of the storage capacitor Cs. Then, after the gate signal G reaches L level (TFT OFF level), the RS signal comes to the L level. Namely, the second electrode of the storage capacitor Cs is maintained at the fixed potential Vs1 until the first TFT 10 turns OFF and the potential of the first electrode is determined. It is therefore possible to reliably prevent the problem that the first electrode potential of the storage capacitor Cs changes by turning the third TFT 30 OFF when the first TFT 10 is ON, to thereby cause the data signal once held on the data line DL to be leaked through the first TFT 10 which is ON.

Figure 5A:
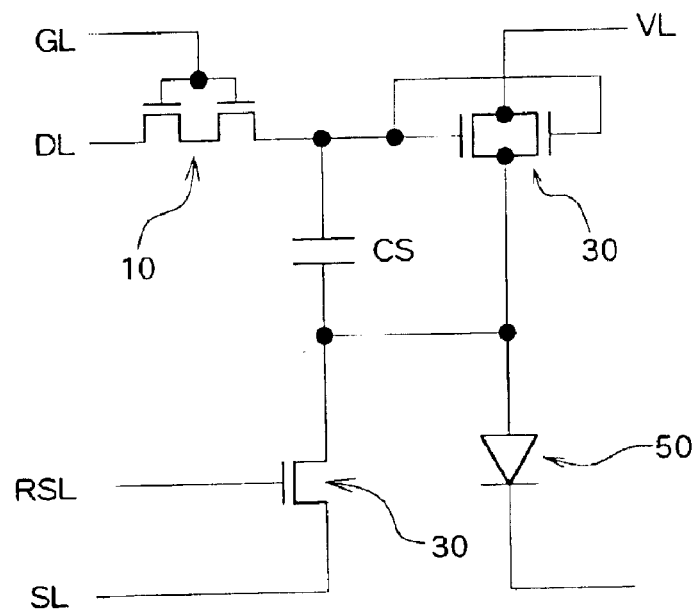
FIG. 5A is a view showing another circuit configuration, corresponding to one pixel, for driving an organic EL element, in accordance with the embodiment of the present invention.
Figure 5B:
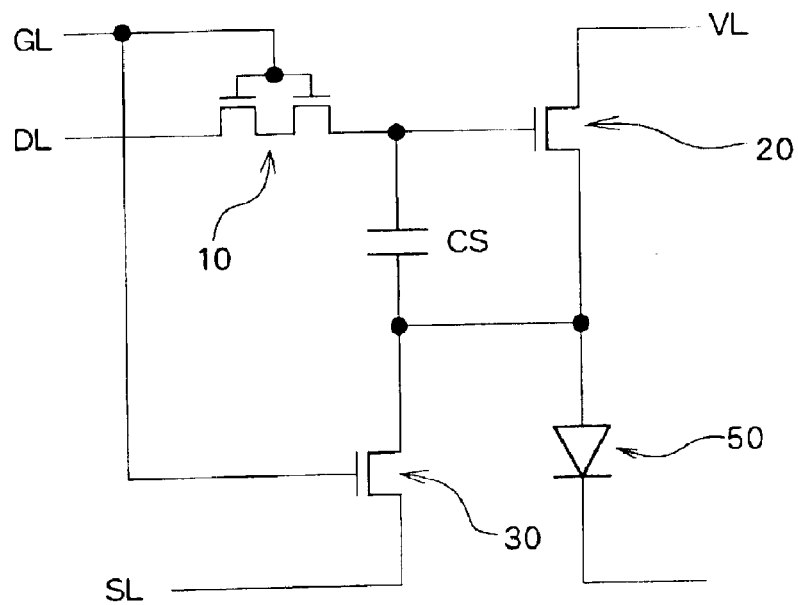
FIG. 5B is a view showing still another circuit configuration, corresponding to one pixel, for driving an organic EL element, in accordance with the embodiment of the present invention.

FIGS. 5A and 5B show another circuit configurations corresponding to one pixel which can be employed in the present embodiment. It should be noted that elements in FIGS. 5A and 5B which are common to those in FIG. 2 are denoted with the same reference numerals and will not be described again below.

The circuit configuration of FIG. 5A differs from that in FIG. 2 only in that a plurality of (two, in this example) n-ch TFTs are provided in parallel between the drive power source line VL and the organic EL element 50, and operates in the same manner as the circuit of FIG. 2. With such a configuration including a plurality of (k) second TFTs 20 connected in parallel, when a current i equally flows in each second TFT 20, a total current of up to "k×i" is supplied to the organic EL element 50. When k=2, for example, even when one second TFT 20 does not operate at all in one pixel in the worst case, compared to the total current "2×i" which are supposed to be supplied to the organic EL element 50 in other pixels, supply of current i to the organic EL element 50 can be assured in this pixel by the other second TFT 20. When only a single second TFT 20 is used, however, the current value becomes "0", indicating a pixel defect, if the one TFT 20 is inoperative as in the case described above. By providing a plurality of second TFTs as shown in FIG. 5A, a variation of the emission intensity of each organic EL element 50 among different pixels can be reduced and a possibility of pixel defect can be remarkably decreased, which contributes to accomplishment of a circuit configuration with enhanced reliability.

The circuit configuration shown in FIG. 5B differs from that in FIG. 2 in that the gate of the third TFT 30, along with the gate of the first TFT 10, is connected to the gate line GL, and these gates are controlled by the same gate signal G. Although a change in the potential held on the storage capacitor Cs can be reduced further reliably when the ON period of the third TFT 30 is set longer than that of the first TFT 10 as shown in FIG. 4, even with a circuit configuration shown in FIG. 5B in which ON/OFF control for both the first TFT 10 and the third TFT 30 is performed at the same timing, it is unlikely that the third TFT 30 turns OFF before the first TFT 10 turns OFF. It is therefore possible to accumulate a charge in accordance with a data signal accurately in the storage capacitor Cs for driving the second TFT 20. Further, the circuit configuration of FIG. 5B can minimize a layout space for the various lines and the third TFT 30 within one pixel, as will be described with reference to FIG. 8. Consequently, the layout region for the organic EL element 50 (the emission region), that is an aperture ratio, is also increased compared to the configurations shown in FIGS. 2 and 5A. It should be noted that a plurality of the second TFTs 20 may be provided in the circuit configuration of FIG. 5B, as in the case of configuration shown in FIG. 5A.

Figure 6:
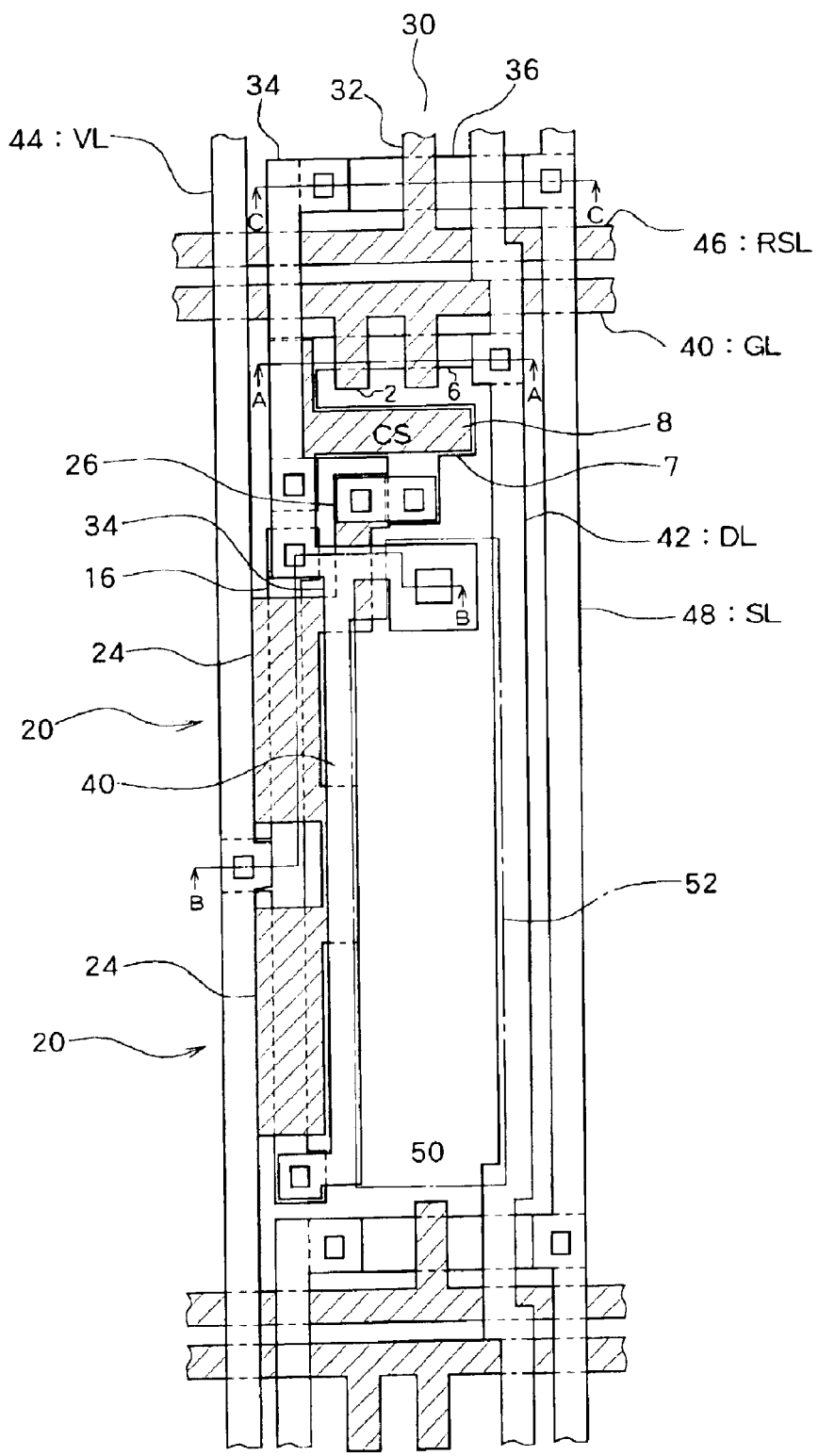
FIG. 6 is a plan view corresponding to one pixel having the circuit configuration shown in FIG. 5A.
Figure 7A:
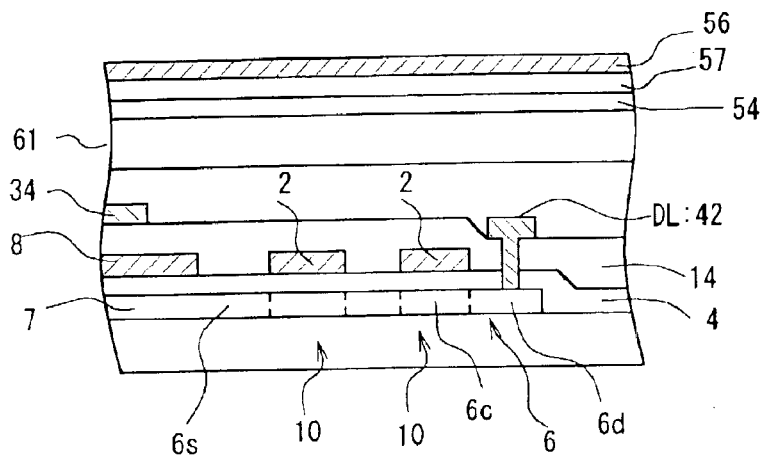
FIGS. 7A, 7B, and 7C are cross sectional views taken along lines A—A, B—B, and C—C, respectively, of FIG. 6.
Figure 7B:
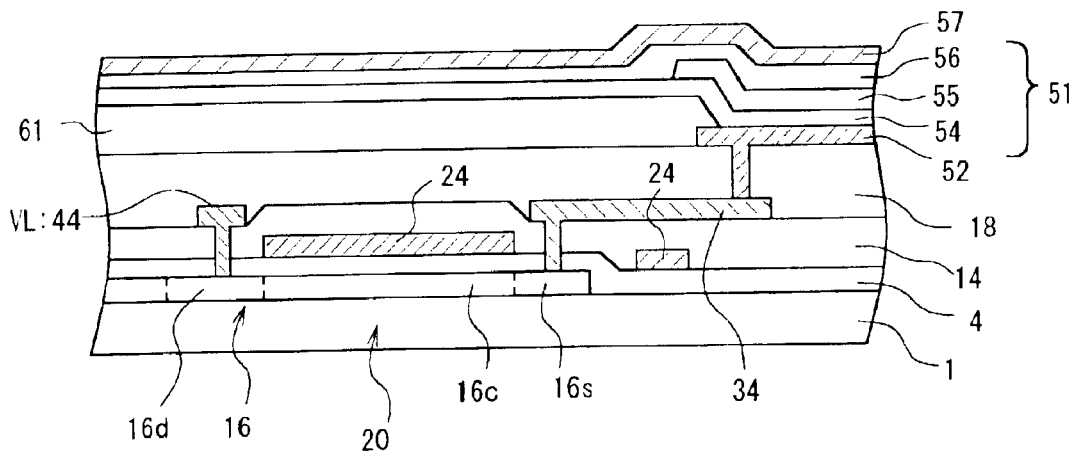
Figure 7C:
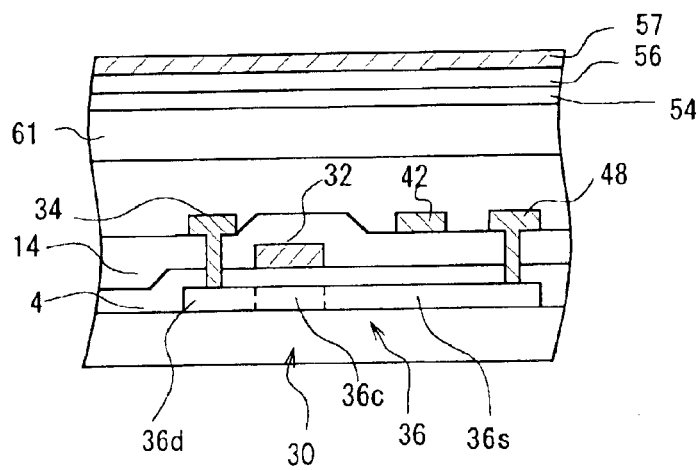

FIG. 6 is a plan view showing an example configuration corresponding to one pixel having the circuit configuration shown in FIG. 5A. FIG. 7A is a cross section of the first TFT 10 taken along line A—A of FIG. 6. FIG. 7B is a cross section of the second TFT 20 taken along line B—B of FIG. 6. FIG. 7C is a cross section of the third TFT 30 taken along line C—C of FIG. 6.

In the configuration of FIG. 6 which corresponds to that in FIG. 5A, each pixel comprises an organic EL element 50, first, second, and third TFTs 10, 20, and 30, respectively, and a storage capacitor Cs within a pixel region. In the example shown in FIG. 6, the gate line (GL) 40 extends in the row direction, and two gate electrodes 2 extend from this gate line 40 above a region for forming an active layer 6 of the TFT 10, to form a double-gate type TFT. Further, the reset line (RSL) 46 for driving the third TFT 30 is formed so as to extend in the row direction in parallel with the gate line 40, and a gate electrode 32 extends from this reset line 46 above the active layer 36 of the third TFT 30.

Further, the data line (DL) 42 for supplying a data signal to the first TFT 10 and the drive power source line (VL) 44 for supplying a current from the drive power source Pvdd to the second TFT 20 are disposed so as to extend in the column direction of the pixels. In addition, the capacitor line (SL) 48 for supplying a fixed potential Vs1 to the second electrode 8 of the storage capacitor Cs via the third TFT 30 (the drain of the TFT 30 in this example) is disposed in the column direction in parallel with the data line 42 and the drive power source line 44.

Further, two second TFTs 20 are connected in parallel between the drive power source line 44 and the organic EL element 50. These two second TFTs 20 are arranged in a straight line in such a manner that the channel length direction of each TFT 20 is aligned with the column direction (which corresponds to the longitudinal direction of the pixel and also with the extending direction of the data line 42 and the drive power source line 44), and the common gate electrode 24 for these TFTs 20 is extracted from the contact portion of the TFT 20 and the first electrode 7 of the storage capacitor Cs so as to extend above the active layer 16 of the second TFT 20. Although the second TFT 20 is not limited to such a layout, with the above arrangement in which the direction of channel length of TFT 20 corresponds to the longitudinal direction of the pixels, it is possible to effectively dispose the second TFT 20 within a limited region of one pixel, when extension of the channel length of the second TFT 20 is desired so as to increase reliability. Further, as will be described below, in a case where polycrystalline silicon obtained by poly-crystallization of amorphous silicon by laser annealing is used as the active layer 16, if the scanning direction of laser annealing is set to the column direction and a configuration is employed in which two second TFTs 20 are arranged in the column direction with a gap therebetween such that the extended channel length is oriented in the column direction as shown in FIG. 6, it is possible to increase the possibility that the active layer 16 of each TFT 20 is irradiated with pulse laser a plurality of times to average a difference (reduce the difference) in characteristics of TFTs 20 among different pixels.

The cross sectional configuration of each circuit element of one pixel will be described, with further reference to FIGS. 7A to 7C. As shown in FIGS. 7A to 7C, according to the present embodiment, all the first, second and third TFTs 10, 20 and 30 adopt the so-called top gate TFT configuration in which the gate electrode (2, 24, 32) is formed above the active layer (6, 16, 36) with a gate insulating film 4 interposed therebetween. (The bottom-gate type may, of course, also be adopted.)

The respective active layers 6, 16, 36 of the first, second, third TFTs 10, 20, 30, respectively, are formed on a transparent insulating substrate 1 such as glass, by polycrystallizing an a-Si layer using the laser annealing process commonly performed for all these TFTs and then patterning p-Si obtained by the laser annealing. In the active layers of all the TFTs, n-type impurities are doped in the source and drain regions using the common doping process, and all the TFTs are thus configured as an n-ch TFT.

The first TFT 10, in which the gate electrodes 2 are protruded from the gate line 40 at two different positions, is formed as a double gate type TFT in term of circuit configuration. The active layer 6 includes an intrinsic channel region 6c in which no impurities are doped, immediately under each gate electrode 2, and the drain region 6d and the source region 6s in which impurities such as phosphorus are doped on either sides of the channel region 6c, so as to form an n-ch TFT.

The drain region 6d of the first TFT 10 is connected to the data line 42 formed on an inter-layer insulating film 14 extending so as to cover the first TFT 10 entirely for supplying a data signal of a color corresponding to the pixel, via a contact hole formed through the opening of the interlayer insulating film 14 and the gate insulating film 4.

The source region 6s of the first TFT 10 also serves as the first electrode 7 of the storage capacitor Cs. The second electrode 8 made of the same material as that of the gate line 40 or the like is formed above the first electrode 7 with the gate insulating film 4 interposed therebetween, and a region in which the first and second electrodes 7 and 8 overlap with each other having the gate insulating film 4 interposed therebetween constitutes the storage capacitor Cs. The first electrode 7 extends into the region where the second TFT 20 is formed (the active layer 16) and is connected with the gate electrode 24 of the second TFT 20 through a connection line 26. The second electrode 8 is connected with the drain 36d of the third TFT 30, the source 16s of the second TFT 20, and an anode 52 of the organic EL element 50 which will be described below, through a common connection line 34 which is formed simultaneously with the data line 42 or the like, also described below, in a layer above the inter-layer insulating film 14 which is formed as so to cover the second electrode 8, the gate electrode 2, and the gate line 40.

The active layer 16 of two second TFTs 20 includes an intrinsic channel region 16c immediately under the gate electrode 24, and the drain region 16d and the source region 16s in which impurities such as phosphorus are doped on either side of the channel region 16c, so as to form an n-ch TFT. In the example shown in FIGS. 6 and 7B, the drain region 16d is common for the two second TFTs 20, and is connected, via a single common contact hole formed through the opening of the inter-layer insulating film 14 and the gate insulating film 4, with the drive power source line 44 which also serves as the drain electrode. The source region 16s of each of the two second TFTs 20, on the other hand, is connected to the common connection line 34 via a contact hole formed in the opening in the inter-layer insulating film 14 and the gate insulating film 4.

The third TFT 30 also has a configuration basically similar to the configurations of the first and second TFTs 10 and 20, and includes a channel region 36c under the gate electrode 32 which is integral with the reset line (RSL) 46, and source region 36s and drain region 36d in which impurities such as phosphorus are doped on either side of the channel region 36c, so as to form an n-ch TFT.

The source region 36s of the third TFT 30 is connected to the capacitor line (SL), which also serves as a source electrode, via a contact hole formed through the opening of the inter-layer insulating film 14 and the gate insulating film 4. The drain region 36d of the third TFT 30 is connected to the common connection line 34, which also serves as a drain electrode, via a contact hole formed through the opening of the inter-layer insulating film 14 and the gate insulating film 4.

Each of the gate electrodes 2 of the first TFT 10 (the gate line 40), the gate electrodes 24 (including the line portion from the connection line 26) of the second TFT 20, the gate electrode 32 of the third TFT 30 (the reset line 46), and the second electrode 8 of the storage capacitor Cs is simultaneously formed by patterning using Cr, for example. Further, each of the data line 42, the drive power source line 44, the capacitor line 48, the common connection line 34, and the connection line 26 is simultaneously formed by patterning using Al, for example. As shown in FIG. 6, the common connection line 34 connected to the source region 16s of the second TFT 20 is provided along the longitudinal direction of the pixel (in the column direction in this example) so as to cover the region between the anode 52 of the organic EL element 50, which will be described later, and the gate electrode forming region of the second TFT 20. Therefore, the common connection line 34 can accomplish the function of interrupting light emitted from the organic EL element 50 toward the glass substrate 1.

The common connection line 34 connected with the source region 36s of the third TFT 30, the second electrode 8 of the storage capacitor Cs, and the source region 16s of the second TFT 20, is in turn connected with the anode 52 of the organic EL element 50 via a contact hole formed through the opening of a first planarizaion insulating film 18 which is formed so as to cover the entire substrate including the connection line 34, the data line 42, the drive power source line 44, and the capacitor line 48, as shown in FIG. 7B.

According to the present embodiment, three types of TFTs, the first, second, and third TFTs 10, 20, and 30 are formed within each pixel, as described above. In this case, with the circuit configuration which allows the use of an n-ch TFT as the second TFT 20, it is possible to form these three types of TFTs 10, 20, and 30 simultaneously through the same process, which then prevents an increase in the number of process steps as would otherwise result when the number of TFTs is increased.

The organic EL element 50 is formed by the transparent anode 52 made of ITO (Indium Tin Oxide) or the like, a cathode 57 made of a metal such as Al, and an emissive element layer (organic layer) 51 made of an organic compound disposed between the anode 52 and the cathode 57. In this embodiment, the anode 52, the emissive element layer 51, and the cathode 57 are sequentially formed in that order from the side of the substrate 1 as shown in FIG. 7B. Further, referring to FIG. 7B, on the first planarization insulating layer 18, a second planarization insulating layer 61 having an opening only at a center region where the anode 52 of the organic EL element 50 is formed is provided so as to cover the edge portion of the anode 52, the line region, the first, second and third TFT forming regions, and the storage capacitor forming region, so that short circuit of the anode 52 and the cathode 57 which is the upper most layer and disconnection of the emissive element layer 51 can be prevented.

The emissive element layer 51, in this example, is formed by sequentially accumulating, from the anode side for example, a hole transport layer 54, an organic emissive layer 55, and an electron transport layer 56 in a laminate structure by vapor deposition or the like. In the case of a color display apparatus in which each pixel is assigned to a different color of R (red), G (green), or B (blue), for example, the emissive layer 55 is made of a different material corresponding to the assigned color. The remaining hole transport layer 54 and the electron transport layer 56 may be formed as common layers for all the pixels as illustrated in FIG. 7B, or may be formed by a different material for each color similar to the emissive layer 55. Example material used for each layer is as follows.

Hole transport layer 54:NBP

Emissive layer: for red (R) . . . doping a dopant of red color (DCJTB) into a host material (Alq$_3$)

for green (G) . . . doping a dopant of green color (Coumarin 6) into a host material (Alq$_3$)

for blue (B) . . . doping a dopant of blue color (Perylen) into a host material (Alq$_3$)

Electron transport layer 56: Alq$_3$

An electron injecting layer made of lithium fluoride (LiF) may be further formed between the cathode 57 and the electron transport layer 56. Further, the hole transport layer 54 may be formed by first and second hole transport layers made of different materials. Also, although each emissive element layer 51 must include the emissive layer 55 including at least an emissive material, the hole transport layer 54 and the electron transport layer 56 or the like described above is not necessarily required depending on a material used for that layer.

The abbreviations used in the above description refer to the following materials:

"NBP" refers to N,N'-di((naphthalene-1-yl)-N,N'-diphenylbenzidine);

"Alq$_3$" refers to tris(8-hydroxyquinolinato) aluminum;

"DCJTB" refers to (2-(1,1-dimethylethyl)-6-(2-(2,3,6, 7tetrahydro-1,1,7,7-tetramethyl-1H,5H-benzo [ij] quinolizin-9-yl)ethenyl)-4H-pyran-4-ylidene) propanedinitrile; and "Coumarin 6" refers to 3-(2-benzothiazolyl)-7-(diethylamino)coumarin.

It should be noted that the configuration and the materials for the emissive element layer 51 are not limited to those described above.

Figure 8:
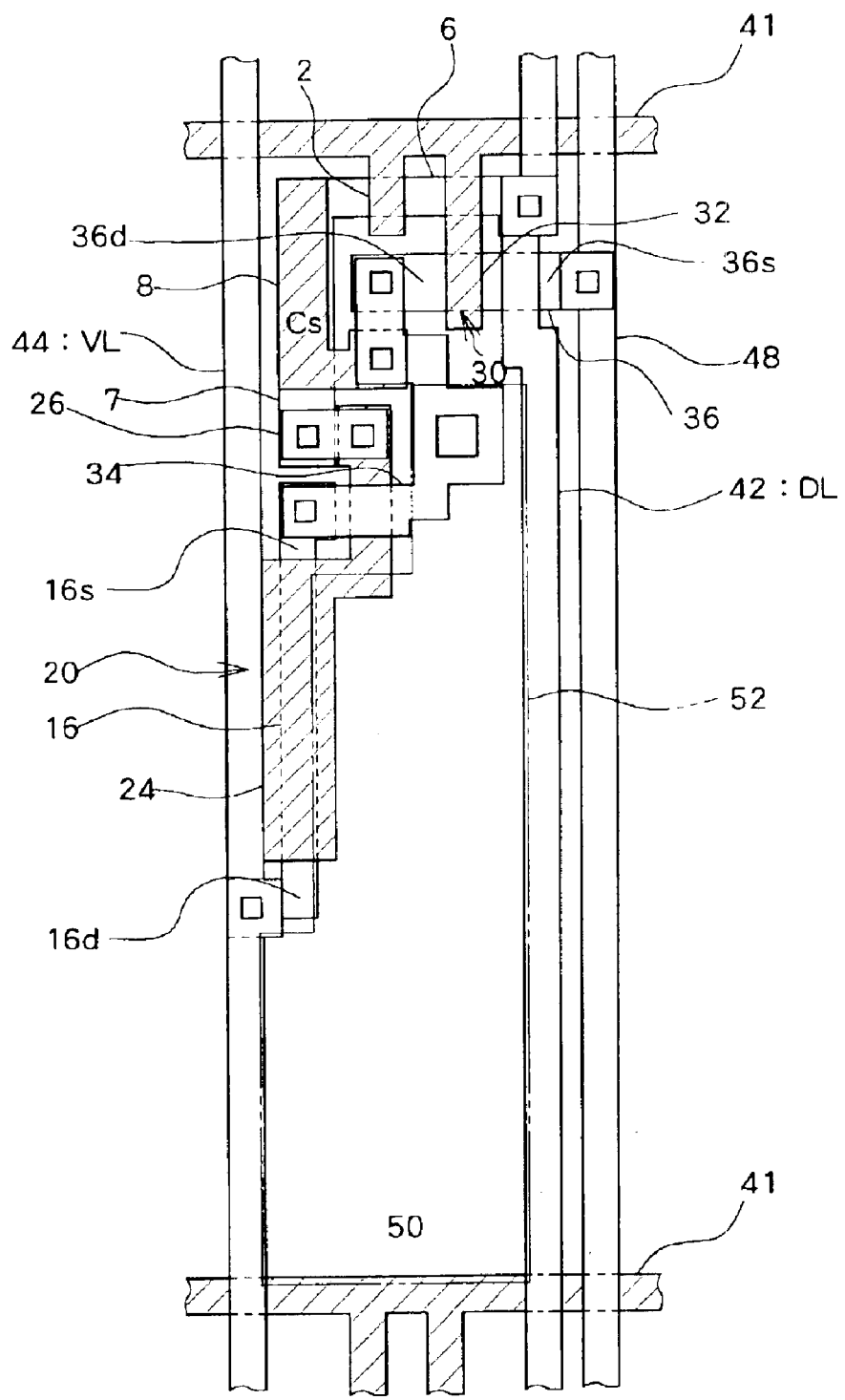
FIG. 8 is a plan view corresponding to one pixel having the circuit configuration shown in FIG. 5B.

Another pixel configuration according to the embodiment of the present invention will be described with reference to FIG. 8. FIG. 8 shows an exemplary plan view corresponding to one pixel having the circuit configuration shown in FIG. 5B, in which parts similar to those in FIGS. 6 and 7 are denoted by the same numerals. The plan configuration shown in FIG. 8 differs from that in FIG. 6 mainly in that the gate line 41 which also serves as the gate electrode 2 of the first TFT 10 for supplying a gate signal G also acts as the gate electrode 32 of the third TFT 30, and in that a single second TFT 20 is provided between the drive power source line 44 and the anode 52 of the organic EL element 50. The cross sectional configuration of each TFT 10, 20, 30, the storage capacitor Cs, and the organic EL element 50 is substantially similar to those shown in FIGS. 7A to 7C. Of course, in the configuration of FIG. 8, the second TFT 20 is also of an n-ch TFT structure, and the gate-source voltage is maintained by the storage capacitor Cs at a voltage in accordance with a data signal.

In the example configuration of FIG. 8, by using the gate line 41 also as the gate electrode 2 of the first TFT 10 and the gate electrode 32 of the third TFT 30, only one gate line 41 is provided for each row as a line extending in the column direction, so that each pixel forming region can be increased accordingly compared to the configuration of FIG. 6. In the example of FIG. 8, the active layer 36 of the third TFT 30 is disposed in parallel with the active layer 6 of the first TFT 10 at the position more distant from the gate line 41 than the active layer 6. The data line 42 for supplying a data signal to the first TFT 10 crosses over the active layer 36 of the third TFT 30. The drain side of the third TFT 30 is connected to the capacitor line 48 which extends in the column direction in parallel with the data line 42. The drain region 36d of the third TFT 30 is connected, via the common connection line 34, with each of the second electrode 8 of the storage capacitor Cs disposed along the longitudinal direction of the drive power source lien 44 in FIG. 8, the source region 16s of the second TFT 20, and the anode 52 of the organic EL element 50.

As is obvious from a comparison of FIGS. 6 and 8, assuming that the pitch of disposing the drive power source line 44 in the row direction is substantially the same in both configurations, the configuration of FIG. 8 can secure a larger area within one pixel for forming the anode 52 of the organic EL element 50, so that a higher aperture ratio, which is synonymous with display at a higher brightness, can be accomplished.

Although in the above examples, poly-crystalline silicon (p-Si) is used for the active layer of each of the first to third TFTs 10, 20 and 30, amorphous silicon (a-Si) may, of course, be used for the active layer. When a TFT including an active layer formed by p-Si is employed, TFTs in which the same p-Si is used for the active layers are formed in the above-described vertical and horizontal drivers for driving each pixel on the same substrate. In such a case, because the TFT of the driver section often adopts a CMOS structure, it is necessary to form both n-ch and p-ch TFTs. When a-Si is used for the TFT of each pixel, on the other hand, a dedicated IC is externally provided as a driver for driving each pixel. According to the present invention, because all of the three types of TFTs formed within one pixel can be configured as an n-ch TFT, it is possible to simplify the manufacturing process compared to a case where a p-ch TFT is used as the second TFT 20.

Further, in each TFT, an LD (Lightly Doped) region may be formed as necessary between the channel and drain regions or between the channel and source regions.

A still further use of the resetting third TFT 30 provided in each pixel in accordance with the present embodiment will be described. During the normal display period, in order to cause the storage capacitor Cs to hold the gate-source voltage of the second TFT 20, the third TFT 30 is controlled ON or OFF at the same timing as the first TFT 10 as described above. However, the third TFT 30 can be used for another use during another period.

Specifically, the third TFT 30 can be used for forcing the charges accumulated between the anode and the cathode of the organic EL element 50 to be discharged at the predetermined timing. During a period in which the gate-source voltage Vgs of the second TFT 20 is maintained at the predetermined level by the storage capacitor Cs, a current in accordance with the voltage Vgs continuously flows between the anode 52 and the cathode 57 of the organic EL element 50 and when the display period of the pixel is completed, a certain degree of charges remain between the anode and the cathode. Such a remaining charge would affect the display content of that pixel at the following display period, and may result in a phenomenon such as image retention. Therefore, by turning the third TFTs 30 of all the pixels ON simultaneously or sequentially at predetermined periods, such as once per vertical scanning period, in the blanking period, for example, it is possible to connect the anode 52 of the organic EL element 50 with the capacitor line 48 to make the anode potential at the potential of the capacitor line 48, that is 0V, for example. Under such a control, charges remaining in the organic EL element 50 can be discharged through the third TFT 30 after completion of one display period and before the start of the following display period, so that high quality display free from image retention or the like can be achieved. Further, because characteristics deterioration in the organic EL element 50 tends to accelerate as a greater amount of current flows therethrough, removal of unnecessary charge can prevent unnecessary current from continuously flowing through the organic EL element 50, thereby extending the life of the organic EL element 50.

For another usage, the third TFT 30 can also be used for inspection of each pixel before shipment from a factory, for example. Specifically, when a data signal for inspection is written while the first TFT 10 is turned ON and the second TFT 20 is then turned ON, a current in accordance with the written inspection data flows from the drive power source line 44 to drain-source of the second TFT 20, and the source voltage of the second TFT 20 should be a voltage in accordance with a current amount supplied to the organic EL element 50. At this time, it is possible to control the third TFT 30 ON to thereby reliably and simply inspect whether or not the source voltage (or a current flowing through the source) of the second TFT 20 can supply an appropriate current to the organic EL element 50 by means of voltage measurement or the like of the capacitor line 48.

Another configuration of the second TFT 20 will be described with reference to FIG. 9. The exemplary configuration of the second TFT 20 shown in FIG. 9 differs from that in FIG. 7 in that the second TFT 20 is configured as a so-called LDD type TFT having a lightly doped (LD) region (typically referred to as LDD regions). In this example, the second TFT 20 has a general single-gate structure, in which LD regions 16LDs are provided. More specifically, on the glass substrate 1, the active layer 16 is formed and the gate insulating film 4 is further formed so as to cover the active layer 16. On the gate insulating film 4 at the portion corresponding to the center portion of the active layer 16, the gate electrode 24 is provided.

Further, at either edge of the active layer 16, the drain region 16d and the source region 16s in which impurities are doped at a high concentration are provided. The portion of the active layer 16 under the gate electrode 24 is the channel region 16c, and a portion between the channel region 16c and the source region 16s and a portion between the channel region 16c and the drain region 16d are LD regions 16LD in which a low concentration of impurities is doped.

When a TFT having larger LD regions compared to the peripheral transistors is used as the second TFT 20, it is possible to increase resistance to high voltage and increase the current amount change with respect to the gate voltage change.

Specifically, when the gate length (in the channel length direction) of the TFT 20 is increased, the range in which a current amount changes with respect to the gate voltage can be increased to thereby improve the accuracy of current amount adjustment using a change in the gate voltage. According to the present embodiment, the large LD configuration can accomplish the same effect as such an increased gate length.

When the width of the gate electrode 24 is actually increased to increase the gate length of TFT, it is necessary to wire such a gate electrode 24 having a wide width (having a long gate length) while insulation between the gate electrode 24 and other elements are secured. According to the present invention, however, as the LD configuration can provide substantially the same effect as increasing the gate length, it is not necessary to increase the width of the light shielding gate electrode 24, and the aperture ratio in one pixel can therefore be improved.

Such an LD configuration may be employed for the first TFT 10 and the TFT of driver circuits.

According to the present embodiment, the LD region of the second TFT 20 is made larger than that of the first TFT 10 and the TFT of driver circuits.

Figure 9:
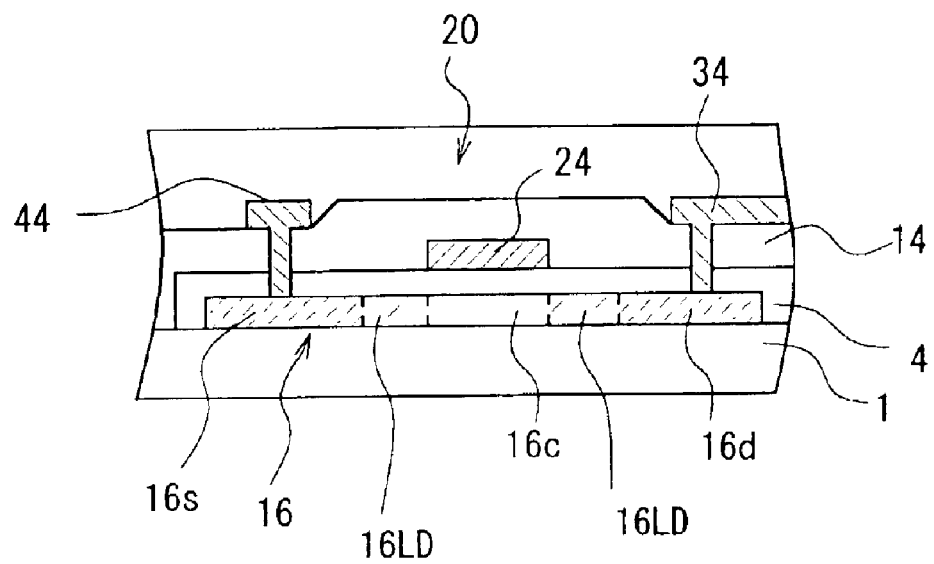
FIG. 9 is a view showing an exemplary configuration of a TFT having an LD structure.
Figure 10:
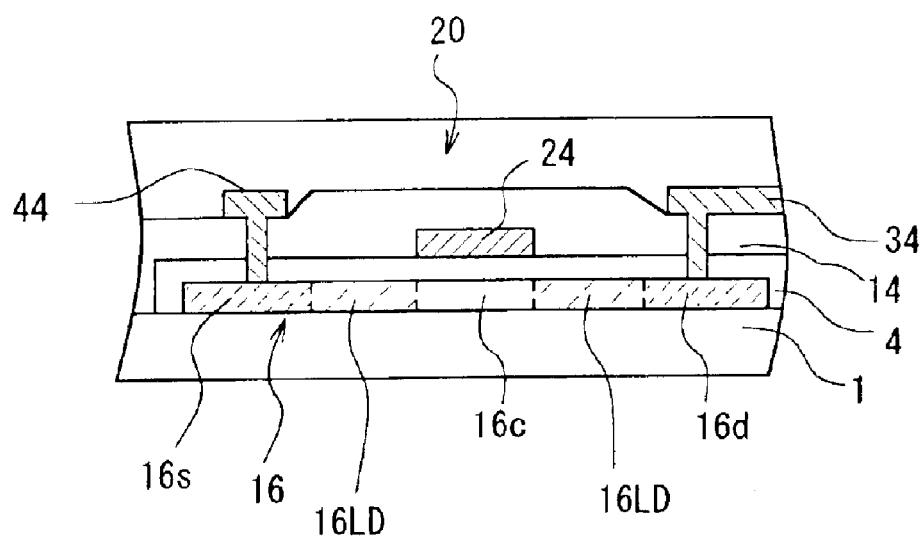
FIG. 10 is view showing an exemplary configuration of a TFT having an enlarged LD region.

Specifically, assume that the LD region of the first TFT 10 or the TFT in driver circuits has a length as shown in FIG. 9, the LD region of the second TFT 20 is made larger as shown in FIG. 10. Consequently, the amount of current can be controlled more accurately without substantially changing the size of the transistor itself. Further, use of a gate electrode having a width similar to that of the gate electrode of other TFTs such as the TFT 10 in the second TFT 20 can facilitate the TFT design.

As described above, because in this LD configuration the gate electrode 24 need not have a large width, the aperture ratio can be increased. Consequently, the emission area per pixel can be increased to thereby increase brightness without changing the amount of current flowing through each organic EL element. On the contrary, due to the increased aperture ratio, the same brightness can be accomplished with a reduced amount of current supplied to the organic EL element, so that deterioration of the organic EL element can be reduced. Further, because the gate length, namely the channel length (including the LD region), can be substantially increased, a variation in characteristics with regard to re-crystallization (poly-siliconization) of the active layer by means of eximer laser annealing can be reduced.

Figure 11:
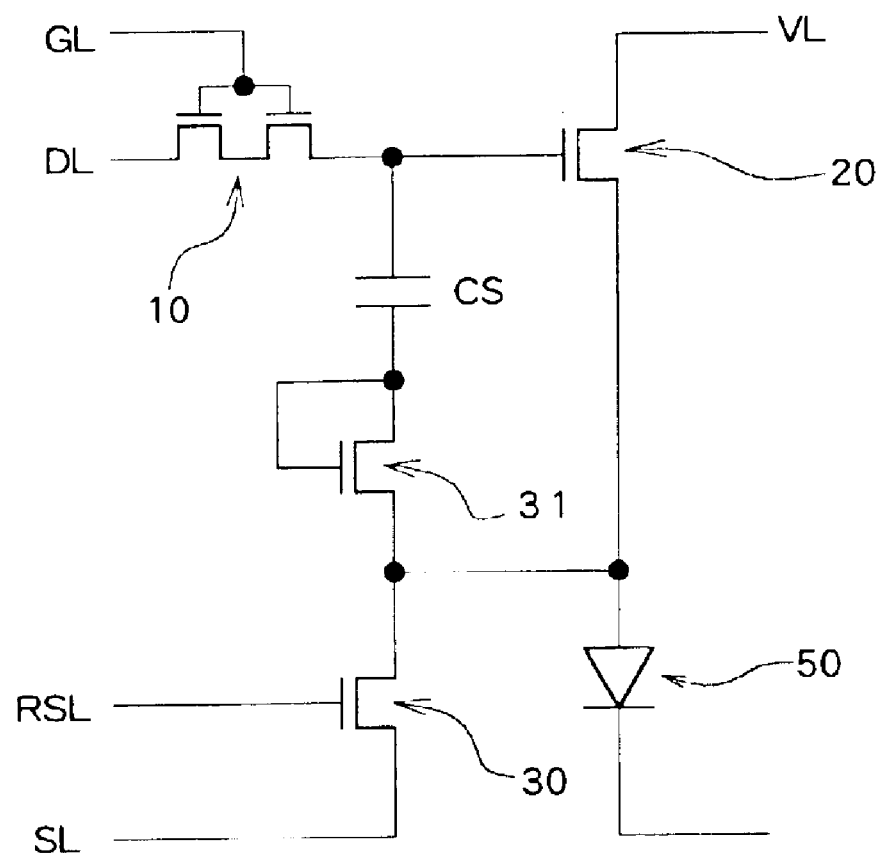
FIG. 11 is a view showing another exemplary configuration of a circuit for generating a gate signal and a reset signal to be supplied to each pixel in accordance with the present invention.

Referring to FIG. 11, a circuit configuration in accordance with another embodiment of the present invention will be described. When compared to the circuit shown in FIG. 2, the circuit of FIG. 11 further includes a diode 31 used for voltage adjustment. More specifically, the diode 31 is provided between the storage capacitor Cs and the third TFT (discharging transistor) 30 and the organic EL element 50. The diode 31 is formed by short-circuit of gate-drain of a TFT having the same configuration as the second TFT 20.

Because this diode 31 is provided, the gate voltage of the second TFT 20 can be set at a sum of the threshold (VtF) of the organic EL element 50, the threshold (Vtn) of the diode 51, and a video signal. It is therefore possible to cause the second TFT 20 to always flow a current corresponding to the video signal regardless of a difference or deterioration of thresholds of the organic EL element 50 and the TFT transistors.

In other words, provision of the diode 31 permits control of a driving current substantially independent from variation or deterioration of element characteristics, so that a display apparatus with less color irregularity can be provided.

Further, in the circuit shown in FIG. 11, the third TFT 30 is provided for setting the anode side potential of the organic EL element 50 at the voltage of the capacitor line SL which is a ground potential to thereby perform initial setting when driving the organic EL element 50. By forcing the anode side potential of the organic EL element 50 to a certain potential (by extracting charges) as described above, the image retention phenomenon can be reduced. In addition, by setting the source side potential of the third TFT 30 at a potential which is further lower than the cathode side potential of the organic EL element, it is possible to reversely bias an organic film including at least an organic emissive film in the organic EL element. Recovery of characteristics of the organic film are thereby accelerated and deterioration of the film characteristics is delayed.

Further, because the third TFT 30 is provided in each pixel, it is possible to activate the reset line RSL of all the pixels connected in the gate line direction to thereby control non-emission time. This permits brightness adjustment and also achieves low power consumption. Further, by connecting the reset lines RSL for each of RGB and varying the ON time for each of RGB, the emission time for each of RGB can be controlled, so that adjustment of white balance and prevention of image deterioration can be accomplished.

Figure 12:
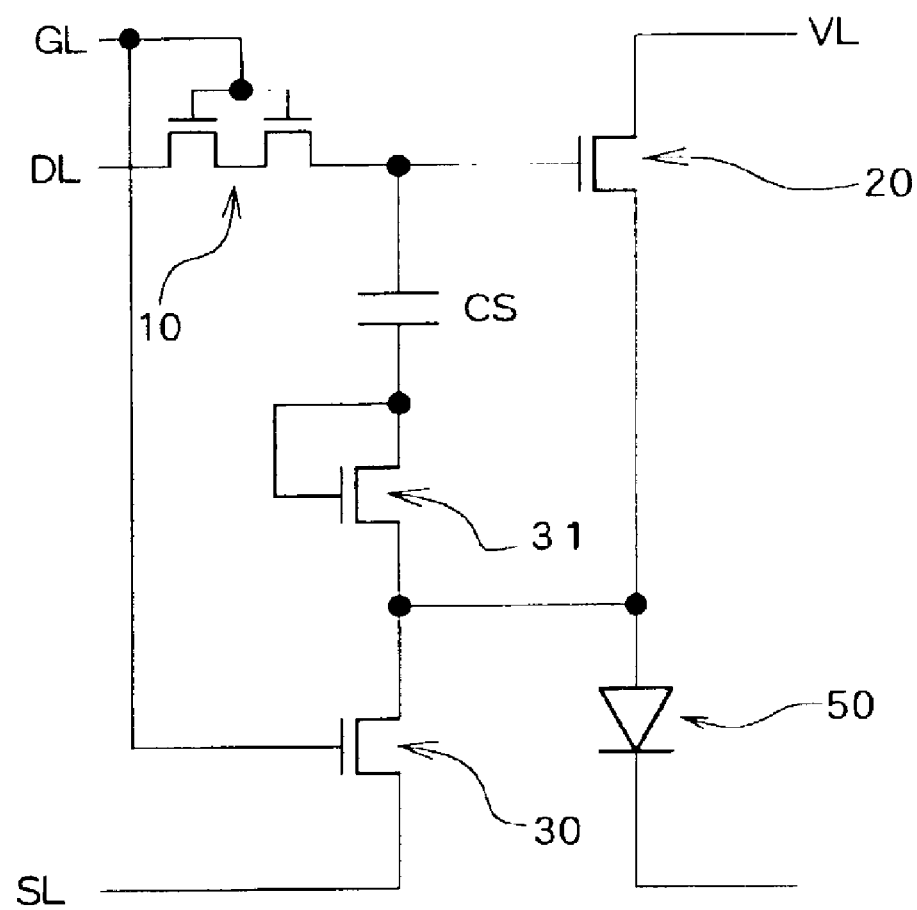
FIG. 12 is a view showing still another exemplary configuration of a circuit for generating a gate signal and a reset signal to be supplied to each pixel in accordance with the present invention.

FIG. 12 shows another exemplary configuration in which the gate of the third TFT 30 shown in FIG. 11 is connected to the gate line GL, not to the reset line RSL. This configuration can also provides the operational effect similar to the case of FIG. 11. More specifically, when the gate line GL is activated, the first TFT 10 is turned ON, and the gate voltage of the second TFT 20 is set at the voltage of the data line DL. Also, because the third TFT 30 is turned ON, a current flows from the power source line VL to the capacitor line SL at the low voltage (ground potential) via the second and third TFTs 20 and 30.

Then, deactivation of the data line DL turns the first and third TFTs 10 and 30 OFF and causes a current from the second TFT 20 to flow through the organic EL element 50 which then emits light.

At this point, the potential on the upper side (the side connected to the second TFT 20) of the organic EL element 50 is at a voltage higher than the voltage drop VtF at the diode 31. On the other hand, due to existence of the voltage drop Vtn at the diode 31, the gate voltage of the second TFT 20 corresponds to the sum of the threshold (VtF) of the organic EL element 50, the threshold (Vtn) of the diode 31 and the voltage of a video signal (Vvideo) when a current is flowing through the organic EL element 50. Accordingly, it is possible to control a driving current substantially independent from variation or deterioration of element characteristics, so that a display apparatus with less color irregularity can be provided, as described above.

While the preferred embodiments of the present invention have been described using specific terms, such description is for illustrative purposes only, and it is to be understood that changes and variations may be made without departing from the spirit or scope of the appended claims.

What is claimed is:

1. A semiconductor device comprising:
   a switching thin film transistor which operates when a selection signal is applied to a gate and also captures a data signal;
   an element-driving thin film transistor in which a drain is connected with a drive power source, a source is connected with an element to be driven, and a gate receives a data signal supplied from the switching thin film transistor, for controlling electric power supplied from the drive power source to the element to be driven;

a storage capacitor having a first electrode connected with the switching thin film transistor and with the gate of the element-driving thin film transistor and a second electrode connected between the source of the element-driving thin film transistor and the element to be driven, for holding a gate-source voltage of the element-driving thin film transistor in accordance with the data signal; and a switching element for controlling a potential of the second electrode of the storage capacitor.

2. A semiconductor device according to claim 1, wherein the element-driving thin film transistor is an n-channel transistor.

3. A semiconductor device according to claim 2, wherein the n-channel element-driving thin film transistor includes an LD region in which a low concentration of impurities is doped, between a channel region and each of source and drain regions in which a high concentration of impurities is doped.

4. A semiconductor device according to claim 3, wherein the LD region of the n-channel element-driving transistor is made larger than an LD region of an n-channel transistor at least in a peripheral circuit.

5. A semiconductor device according to claim 1, wherein the element to be driven is an electroluminescence element.

6. A semiconductor device according to claim 1, wherein the switching element controls the potential of the second electrode of the storage capacitor in accordance with the ON or OFF state of the switching thin film transistor.

7. A semiconductor device according to claim 6, wherein the switching element controls the second electrode of the storage capacitor at a fixed potential when the switching thin film transistor is ON.

8. A semiconductor device according to claim 6, wherein the switching element controls the second electrode of the storage capacitor at the fixed potential before the switching thin film transistor is turned ON, and halts potential control for the second electrode of the storage capacitor after the switching thin film transistor is turned OFF.

9. A semiconductor device according to claim 6, wherein the switching element is a thin film transistor and controls the potential of the second electrode of the storage capacitor in accordance with a predetermined reset signal or a selection signal supplied to the switching thin film transistor.

10. A semiconductor device according to claim 1, wherein the switching element is connected with the source of the element-driving thin film transistor and is used for discharging, at a predetermined timing, a charge accumulated in the element to be driven.

11. A semiconductor device according to claim 1, wherein the switching element is connected with the source of the element driving thin film transistor and is used for measuring the source potential or current of the element-driving thin film transistor connected to the element to be driven.

12. An active matrix display apparatus including a plurality of pixels arranged in a matrix, in which each pixel comprises, at least:

an element to be driven;

a switching thin film transistor which operates when a selection signal is applied to a gate and which captures a data signal;

an element-driving thin film transistor in which a drain is connected with a drive power source, a source is connected with the element to be driven, and a gate receives a data signal supplied from the switching thin film transistor, for controlling electric power supplied from the drive power source to the element to be driven;

a storage capacitor having a first electrode connected with the switching thin film transistor and with the gate of the element-driving thin film transistor and a second electrode connected between the source of the element-driving thin film transistor and the element to be driven, for holding a gate-source voltage of the element-driving thin film transistor in accordance with the data signal; and a switching element for controlling a potential of the second electrode of the storage capacitor.

13. A display apparatus according to claim 12, wherein the element-driving thin film transistor is an n-channel transistor.

14. A display apparatus according to claim 13, wherein the n-channel element-driving thin film transistor includes an LD region in which a low concentration of impurities is doped, between a channel region and each of source and drain regions in which a high concentration of impurities is doped.

15. A display apparatus according to claim 14, wherein the LD region of the n-channel element-driving transistor is made larger than an LD region of an n-channel transistor, at least in a peripheral circuit.

16. A display apparatus according to claim 12, wherein the element to be driven is an electroluminescence element.

17. A display apparatus according to claim 12, wherein the switching element controls the potential of the second electrode of the storage capacitor in accordance with ON and OFF of the switching thin film transistor.

18. A display apparatus according to claim 17, wherein the switching element controls the second electrode of the storage capacitor at a fixed potential when the switching thin film transistor is ON.

19. A display apparatus according to claim 17, wherein the switching element controls the second electrode of the storage capacitor at the fixed potential before the switching thin film transistor is turned ON, and halts potential control for the second electrode of the storage capacitor after the switching thin film transistor is turned OFF.

20. A display apparatus according to claim 17, wherein the switching element is a thin film transistor and controls the potential of the second electrode of the storage capacitor in accordance with a predetermined reset signal or a selection signal supplied to the switching thin film transistor.

21. A display apparatus according to claim 12, wherein the switching element is connected with the source of the element-driving thin film transistor and is used for discharging, at a predetermined timing, a charge accumulated in the element to be driven.

22. A display apparatus according to claim 12, wherein the switching element is connected with the source of the element-driving thin film transistor and is used for measuring the source potential or current of the element-driving thin film transistor connected to the element to be driven.

23. A display apparatus including a plurality of electroluminescence elements arranged in a matrix, wherein
- a driving transistor is provided corresponding to each electroluminescence element for controlling a drive current to be supplied to the electroluminescence element,
- the driving transistor is an n-channel transistor and includes an LD region in which a low concentration of impurities is doped, between a channel region and each of source and drain regions in which a high concentration of impurities is doped,
- a gate of the driving transistor is connected with a switching transistor and one end of a capacitor,
- a connection point of the electroluminescence element and the driving transistor is connected to a low volage power source via a discharge transistor, and
- the connection point of the electroluminescence element and the driving transistor is also connected with the second end of the capacitor.

24. A display apparatus including a plurality of electroluminescence element arranged in a matrix, wherein
- a driving transistor is provided corresponding to each electroluminescence element for controlling a drive current to be supplied to the electroluminescence element,
- the driving transistor is an n-channel transistor and includes an LD region in which a low concentration of impurities are doped, between a channel region and each of source and drain regions in which a high concentration of impurities are doped,
- the LD region of the driving transistor is made larger than an LD region of an n-channel transistor at least in a peripheral circuit,
- a gate of the driving transistor is connected with a switching transistor and one end of a capacitor,
- a connection point of the electroluminescence element and the driving transistor is connected to a low voltage power source via a discharge transistor, and
- the connection point of the electroluminescence element and the driving transistor is also connected with the other end of the capacitor.

* * * * *